(12) United States Patent
Coene et al.

(10) Patent No.: US 6,232,896 B1
(45) Date of Patent: May 15, 2001

(54) DEVICE FOR ENCODING N-BIT SOURCE WORDS INTO CORRESPONDING M-BIT CHANNEL WORDS AND DECODING M-BIT CHANNEL WORDS INTO CORRESPONDING N-BIT SOURCE WORDS

(75) Inventors: Willem M. J. Coene; Josephus A. H. M. Kahlman, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/469,447

(22) Filed: Dec. 21, 1999

(30) Foreign Application Priority Data

Dec. 21, 1998 (EP) .................................................. 98204355

(51) Int. Cl.$^7$ ..................................................... H03M 7/20
(52) U.S. Cl. .......................... 341/102; 341/95; 340/347; 375/19
(58) Field of Search ............................... 341/102, 67, 58, 341/95; 340/347; 375/19

(56) References Cited

U.S. PATENT DOCUMENTS 5,477,222 * 12/1995 Kahlman et al. ...................... 341/95

FOREIGN PATENT DOCUMENTS

| 0758825A1 | * | 2/1997 | (EP) | ............................. H04L/25/49 |
| WO 99/33183 | * | 7/1999 | (NL) | . |
| WO 99/35747 | * | 7/1999 | (NL) | . |
| WO9933183 | * | 7/1999 | (WO) | ............................. H03M/5/14 |
| WO9935747 | * | 7/1999 | (WO) | ............................. H03M/7/00 |

* cited by examiner

*Primary Examiner*—Brian Young
*Assistant Examiner*—John Nguyen
(74) *Attorney, Agent, or Firm*—Michael E. Belk

(57) ABSTRACT

An encoding device encodes a stream of databits of a binary source signal into a stream of databits of a binary channel signal, wherein the stream of databits of the source signal is divided into n-bit source words, which device includes converting apparatus to convert the n-bit source words into corresponding m-bit channel words in accordance with a conversion of the parity preserve type, where m and n are integers, with m>n. The device further includes control apparatus for carrying out DC-control on the binary channel signal by introducing a freedom of choice in the source-to-channel conversion. A decoding device decodes the channel signal obtained from the encoding device.

19 Claims, 4 Drawing Sheets

DEVICE FOR ENCODING N-BIT SOURCE WORDS INTO CORRESPONDING M-BIT CHANNEL WORDS AND DECODING M-BIT CHANNEL WORDS INTO CORRESPONDING N-BIT SOURCE WORDS

Device for encoding n-bit source words into corresponding m-bit channel words and decoding m-bit channel words into corresponding n-bit source words.

BACKGROUND OF THE INVENTION

1. Field of the Invention

The invention relates to a device for encoding a stream of databits of a binary source signal into a stream of databits of a binary channel signal, wherein the stream of databits of the source signal is divided into n-bit source words, which device comprises converting means conceived to convert said n-bit source words into corresponding m-bit channel words in accordance with a conversion of the parity preserve type, where m and n are integers, with m>n.

The invention also relates to a method of encoding a stream of databits of a binary source signal into a stream of databits of a binary channel signal, wherein the stream of databits of the source signal is divided into n-bit source words, said source words being converted into corresponding m-bit channel words in accordance with a conversion of the parity preserve type, where m and n are integers, with m>n.

The invention further relates to a binary channel signal comprising a stream of databits, converted from a binary source signal comprising a stream of databits, wherein the stream of databits of the source signal comprises n-bit source words, the channel signal comprising m-bit channel words, each one of said m-bit channel words corresponding to one of said n-bit source words in accordance with a conversion of the parity preserve type, where m and n are integers, with m>n.

The invention further relates to a record carrier comprising a binary channel signal comprising a stream of databits, converted from a binary source signal comprising a stream of databits, wherein the stream of databits of the source signal comprises n-bit source words, the channel signal comprising m-bit channel words, each one of said m-bit channel words corresponding to one of said n-bit source words in accordance with a conversion of the parity preserve type, where m and n are integers, with m>n.

The invention further relates to a device for decoding a stream of databits of a binary channel signal into a stream of databits of a binary source signal, wherein the stream of databits of the channel signal is divided into m-bit channel words, which device comprises deconverting means conceived to deconvert said m-bit channel words into corresponding n-bit source words in accordance with a deconversion of the parity preserve type, where m and n are integers, with m>n.

2. Description of the Relate Art

An encoding device and a decoding device mentioned in the foregoing are known from U.S. Pat. No. 5,477,222 (PHN 14448). The document discloses a device for encoding a stream of databits of a binary source signal into a stream of databits of a binary channel signal, satisfying a (1,7) runlength constraint. This means that, in a serial datastream of the channel signal, minimally one 'zero' and maximally seven 'zeroes' are present between two consecutive 'ones' in the channel signal. The device further realizes a minimization of the repeated minimum transition runlength.

In this respect it should be noted that, normally, an additional precoding step, such as a 1T precoding, is applied to the (1,7) constrained sequence, resulting in a runlength-limited sequence with a minimum runlength of 2 and a maximum runlength of 8.

The known conversion is parity preserving (PP). 'Parity preserving' means that the parity of the n-bit source words to be converted equals the parity, after modulo-2-addition, of the corresponding m-bit channel words in which they are converted. As a result, the encoding device as claimed does not influence the polarity of the signal.

As the conversion is parity preserving, DC-control can be applied by inserting DC-control bits in the datastream of the source words, which is more efficient than the insertion of extra bits in the channel bitstream, the so-called merging bits. DC-control implies the reduction of the power of the channel bit stream near zero frequency. The spectral notch at DC allows retrieval of the threshold level from the detected waveform, which is essential for detection and timing-recovery with the PLL.

In this PP channel code, no additional DC-control is present in order to further reduce the power of the channel bit stream near zero frequency, or to reduce the overhead for DC-control by reduction of the number of parity preserve DC-control bits.

SUMMARY OF THE INVENTION

It is an object of the invention to provide an improved device for encoding n-bit source words into corresponding m-bit channel words, in which extra DC-control is possible.

The device in accordance with the invention is characterized in that the device further comprises control means for carrying out DC-control on said binary channel signal by introducing a freedom of choice in the source-to-channel conversion.

The invention is based on the recognition that DC-control will be made possible by introducing an appropriate freedom of choice in the source-to-channel mapping. Therefore, two options in the choice for some particular source-to-channel conversions are created. Both options are different in one extra '1' in the channel bitstream in NRZI-notation, i.e. the difference is one extra transition in the channel bitstream. Due to this extra transition, the so-called running-digital sum (RDS) value can be kept within certain bounds. This kind of DC-control will be referred to as stochastic DC-control.

In the parity preserve channel code, already mentioned in U.S. Pat. No. 5,477,222, DC-control is also performed by limiting the RDS within certain bounds. The main difference with the known parity preserve channel code is that this code needs extra bits, the so-called parity preserve bits, before the channel encoding operation in order to control the RDS value. In this invention, the RDS value can also be controlled be introducing a freedom of choice in the source-to-channel mapping with double options. In order to maintain the same amount of DC-control, fewer extra bits can be used, allowing a higher capacity of the record carrier with signals encoded in accordance with the presented code stored on it.

The device in accordance with the invention is also characterized in that the device further comprises control means conceived to minimize the repeated minimum transition runlength on said binary channel signal by introducing a freedom of choice in the source-to-channel conversion.

The invention is based on the recognition that in encoding in accordance with the known encoding device, relatively long sequences comprising only the minimum transition runlength may occur, leading to a deterioration of the bit detection in a receiver, followed by transmission and subsequent decoding of the channel signal in the receiver. In a channel signal satisfying a specific runlength constraint, such as (1,7) or (1,8), this means that relatively long sequences '... 0101010101...' occur, resulting in relatively long sequences '... 001100110011....' in the sequence after 1T preceding. The devices in accordance with the invention restrict the lengths of these sequences, so that an improved bit-detection in a receiver can be realized. Such a restriction is known as R epeated Minimum Runlength Limitation (RML).

The method in accordance with the invention is characterized in that the method further carries out DC-control on the binary channel signal by introducing a freedom of choice in the source-to-channel conversion.

The signal in accordance with the invention is characterized in that in said binary channel signal, a pair of blocks of p consecutive m-bit channel words, being converted from the same block of p consecutive n-bit source words, is present, the blocks of the pair differing from each other in the bit value at one bit position only in said blocks, p being an integer which is larger than 1.

The record carrier in accordance with the invention is characterized in that, in said binary channel signal, a pair of blocks of p consecutive m-bit channel words, being converted from the same block of p consecutive n-bit source words, is present, the blocks of the pair differing from each other in the bit value at one bit position only in said blocks, p being an integer which is larger than 1.

The decoding device in accordance with the invention is characterized in that said deconverting means are also conceived to deconvert a channel sequence comprising pairs of blocks of p consecutive m-bit channel words into the same blocks of p consecutive n-bit source words, the pairs of blocks of p consecutive m-bit channel words differing from each other in the bit value at one bit position only in said blocks, p being an integer which is larger than 1.

With this device, the binary data signal comprising a stream of databits, characterized in that, in said binary channel signal, a pair of blocks of p consecutive m-bit channel words, being converted from the same block of p consecutive n-bit source words, is present, the blocks of the pair differing from each other in the bit value at one bit position only in said blocks, p being an integer which is larger than 1, can be deconverted into a binary source signal comprising a stream of databits.

BRIEF DESCRIPTION OF THE DRAWINGS

The invention will be further described in the following Figure description in which.

DETAILED DESCRIPTION OF THE INVENTION

Figure 1:
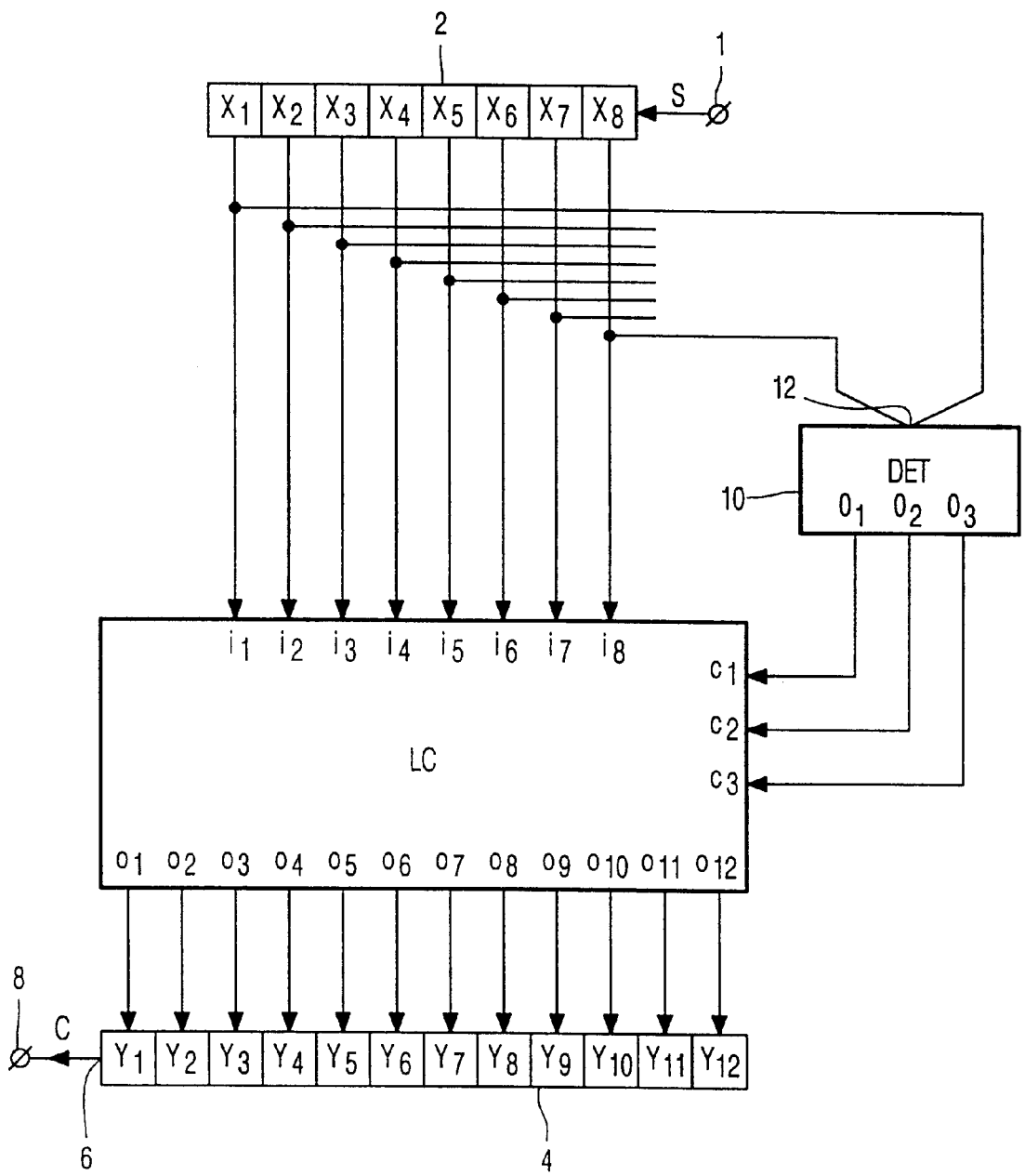
FIG. 1 shows a first embodiment of the encoding device.

FIG. 1 shows an encoding device that is capable of converting 2-bit source words into 3-bit channel words. The device has an input terminal 1 for receiving a stream of databits of a binary source signal S. The terminal 1 is coupled to an input of a shift register 2 having eight cells $X_1$ to $X_8$, in the present example, so as to receive eight consecutive source bits of the source signal S. The shift register 2 functions as a serial-parallel converter. The outputs of the cells are coupled to corresponding inputs $i_1$ to $i_8$, respectively, of a logic circuit LC, for supplying the logic values $(x_1, \ldots, x_8)$ of the source bits present in the cells. The logic circuit LC forms part of the converting means CM.

The device further includes a second shift register 4 having twelve cells $Y_1$ to $Y_{12}$. The logic circuit LC has twelve outputs $o_1$ to $o_{12}$. These outputs of the logic circuit LC are coupled to corresponding inputs of the twelve cells $Y_1$ to $Y_{12}$, respectively, of the shift register 4. An output 6 of the shift register 4 is coupled to an output terminal 8. The shift register 4 functions as a parallel-serial converter, so as to obtain the binary channel signal C.

Furthermore, a detector unit 10 is available for detecting specific sequences in the serial datastream of the source signal S. To this end, the outputs of the eight cells $X_1$ to $X_8$ of the shift register 2 are coupled to corresponding inputs, denoted 12, of the detector unit 10. In the present embodiment, the detector unit 10 has three outputs, denoted $O_1$, $O_2$ and $O_3$, for generating a first, a second and a third control signal, respectively. These outputs are coupled to corresponding control signal inputs $c_1$, $c_2$ and $c_3$, respectively, of the logic circuit LC.

The logic circuit LC functions as follows in response to the control signals applied to its inputs $c_1$, $c_2$ and $c_3$. The logic circuit LC is capable of converting 2-bit source words SW into 3-bit channel words. As an example, the converting means LC is adapted to convert the 2-bit source words SW into 3-bit channel words CW in accordance with the following Table 1.

TABLE 1

| Source word | channel word |
| --- | --- |
| 00 | 101 |
| 01 | 100 |
| 10 | 001 |
| 11 | 000 |

It can be seen that converting the source words in accordance with this table results in the preserving of the parity, because the parity of the n-bit source words to be converted equals the parity, after modulo-2 addition, of the corresponding m-bit channel words into which they are converted.

It should be noted here that the first bit in the source word is applied first to the shift register 2 and that the first bit in the channel word is supplied first from the output 6 of the shift register 4.

It should be further noted here that the logic circuit LC converts 2-bit source words stored in the cells $X_1, X_2$ into 3-bit channel words and stores these channel words in the cells $Y_1, Y_2, Y_3$ of the shift register 4, in response to an absence of any control signal at the control signal inputs $c_1, c_2$ and $c_3$. Each conversion in this way is followed by a shift over two positions to the left in the shift register 2, and a shift over three positions to the left in the shift register 4. The shift over two positions in the shift register 2 is required to prepare the shift register 2, and thus the converter, for a subsequent conversion. The shift over three positions in the shift register 4 is required to output the generated 3-bit channel word.

The device of FIG. 1 can be used to generate a channel signal C in the form of a (d,k) sequence satisfying the d=1 constraint. This means that at least one 'zero' is present between two subsequent 'ones' in the serial datastream of the channel signal. That is, a concatenation of two or more 'ones' in the channel signal is prohibited.

The unmodified conversion, such as by means of the device of FIG. 1, of combinations of two subsequent 2-bit source words might violate the d=1 constraint. These combinations are the combinations '00 00', which, by unmodified conversion, would lead to the two 3-bit channel words '101 101'; '00 01', which, by unmodified conversion, would lead to the two 3-bit channel words '101 100'; '10 00', which, by unmodified conversion, would lead to the two 3-bit channel words '001 101' and '10 01', which, by unmodified conversion, would lead to the two 3-bit channel words '001 100'.

The occurrence of such combinations should be detected so that a modified encoding of blocks of two 2-bit source words into blocks of two 3-bit channel words can take place. Therefore, in addition to the 'normal' encoding of 2-bit source words into 3-bit channel words. the device of FIG. 1 is capable of detecting the above identified combinations and of realizing a modified encoding, such that the d=1 constraint in the channel signal is still satisfied.

Since the outputs of the cells $X_1$ to $X_4$ of the shift register 2 are coupled to corresponding inputs of the detector unit 10, this detector unit 10 is capable of detecting the position in the serial bitstream of the source signal where unmodified encoding of single 2-bit source words in the bitstream into corresponding single 3-bit channel words would lead to a violation of the d=1 constraint in the channel signal C, and is adapted to supply a control signal at its output $O_1$ in response to such a detection.

More specifically, the detector unit 10 detects whether the cells $X_1$ to $X_4$ comprise one of the 4-bit sequences that are given in Table 2, and generates a first control signal at its output $O_1$. As soon as the detector unit 10 detects a combination of two 2-bit source words present in the four cell positions $x1,x_2,x_3,x_4$, which combination equals one of the combinations given in the left-hand column of Table 2, the logic circuit LC converts the combination in accordance with the modified coding given in Table 2.

TABLE 2

| block of 2 source words | Block of 2 channel words/ unmodified coding | block of 2 channel words/ modified coding |
|---|---|---|
| 0000 | 101 101 | 100 010 |
| 0001 | 101 100 | 101 010 |
| 1000 | 001 101 | 000 010 |
| 1001 | 001 100 | 001 010 |

As can be seen from the Table, unmodified conversion of the single two 2-bit source words leads to a violation of the d=1 constraint, as two 'ones' occur at the boundary between the two channel words obtained. The logic circuit LC is therefore adapted to convert, in a modified coding mode, the blocks of two 2-bit source words given in the left column of the above Table into the blocks of two 3-bit channel words given in the right column in Table 2. As can be seen, no violation of the d=1 constraint occurs anymore. Furthermore, one of the two 3-bit channel words is unequal to one of the four channel words of Table 1, namely the code word 010. The reason for this is that, on the receiver side, a detection of this 3-bit channel word not belonging to the set of four 3-bit channel words of Table 1 is possible, so that a corresponding decoding, which is the inverse of the encoding as defined with reference to Table 2, can be realized.

The block of two 3-bit channel words, obtained by means of the encoding in conformity with Table 2, is supplied by the logic circuit LC to its outputs $o_1$ to $o_6$, which channel words are supplied to the six cells $Y_1$, to $Y_6$ of the shift register 4.

It will further be clear that a conversion of two 2-bit source words into two 3-bit channel words by the converter unit LC is followed by a shift over four positions to the left in the shift register 2 and a shift over six positions to the left in the shift register 4. The shift over four positions in the shift register 2 is required to prepare the shift register 2, and thus the converter, for a subsequent conversion. The shift over six positions in the shift register 4 is required to output the two generated 3-bit channel words.

As mentioned hereinbefore, the detector unit 10 is available for detecting specific sequences in the serial datastream of the source signal S. In order to make DC-control possible, the running-digital sum (RDS) value must be held within certain bounds. Therefore, the detector unit 10 detects whether the cells $X_1$ to $X_6$ comprise one of the 6-bit sequences that are given in Table 3, and generates a second control signal at its output $O_2$.

TABLE 3

| block of 3 source words | block of 3 channel words |
|---|---|
| 00 10 00 | 101 0x0 010 |
| 01 10 00 | 100 0x0 010 |
| 10 10 00 | 001 0x0 010 |
| 11 10 00 | 000 0x0 010 |

As soon as the detector unit 10 detects a combination of three 2-bit source words present in the six cell positions $x_1,x_2,x_3,x_4,x_5,x_6$, which combination equals one of the combinations given in the left-hand column of Table 3, the logic circuit LC converts the combination in accordance with the coding given in Table 3, where the bit marked 'x' indicates that a choice can be made between the values '0' and '12 , depending on the RDS value of the signal at that moment.

It should be noted that the bitstream of the channel words is in NRZI (non-return to zero-inverse) notation, which means that a 'one' results in a transition in the write current for recording the channel signal on a magnetic record carrier.

Moreover, it can be shown that one entry in Table 2 can be omitted (e.g. the $4^{th}$ entry), so that it becomes possible to perform stochastic DC-control by creating a freedom of choice in the source-to-channel conversion (e.g. 10 11 being converted into 001 0x0) and by dealing with the d=1 violations due to the omission of one entry in Table 2 by means of the entries of Table 3. In this way, stochastic DC-control can also be performed when a block of 2 consecutive n-bit source words is converted into a block of 2 consecutive m-bit channel words.

More specifically, the detector unit 10 detects whether the cells $X_1$ to $X_8$ comprise one of the 8-bit sequences that are given in Table 4, and generates a third control signal at its output $O_3$.

As soon as the detector unit 10 detects a combination of four 2-bit source words present in the eight cell positions $x_1,x_2,x_3,x4,x_5,x_6,x_7,x_8$, which combination equals one of the combinations given in the left-hand column of Table 4, the logic circuit LC converts the combination in accordance with the coding given in Table 4 into a 12-bit bit sequence as given in the right column of this Table 4.

TABLE 4

| block of 4 source words | block of 4 channel words |
| --- | --- |
| 11 11 11 11 | 001 010 010 010 |
| 11 11 11 10 | 000 010 010 010 |
| 01 11 11 10 | 100 010 010 010 |
| 01 11 11 11 | 101 010 010 010 |

Use of this Table 4 guarantees a k-constraint of k=11. The conversion as per Table 4 is again parity preserving.

In the foregoing, the situations where a modified encoding is required are detected by the detector unit 10 from the source words. It should, however, be noted that detection could also be carried out on the generated channel words.

Figure 2:
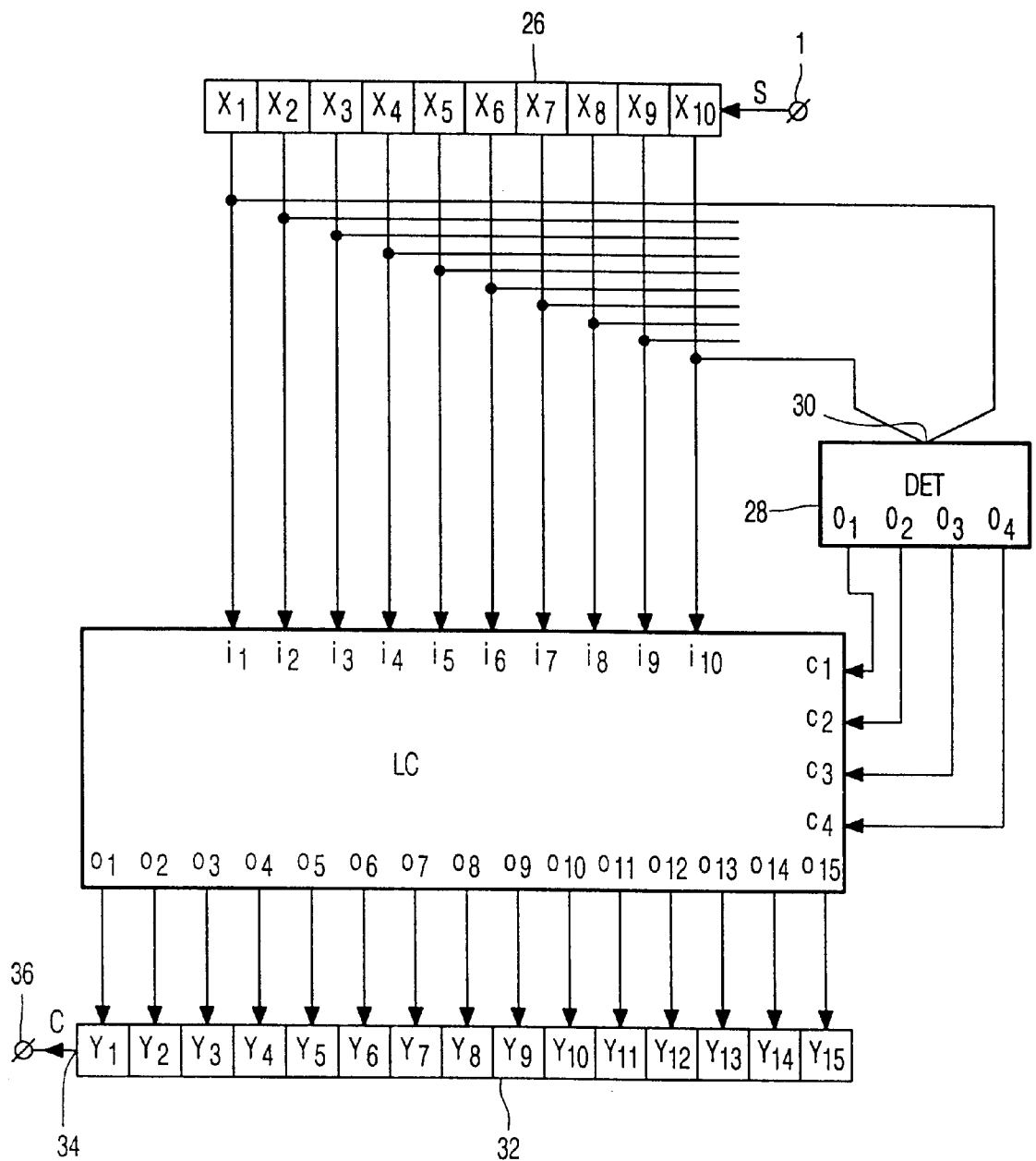
FIG. 2 shows a second embodiment of the encoding device.

FIG. 2 shows a second encoding device that is capable of converting 2-bit source words into 3-bit channel words. For the general functioning of this device, reference is made to the description of the device in FIG. 1. The encoding device shown in FIG. 2 will be capable of generating a channel code with a constraint k=10 and RML=6, as will be explained hereinafter.

A further requirement for encoding the source signal is that the repeated minimum transition runlength in the channel signal should be limited. The repeated minimum transition runlength is defined as the length of the sequence of subsequent transitions between '0' and '12 , or: a sequence ' . . . 01010101010. . .', in the case where the d-constraint equals 1. As an example, the bit sequence '00 01 00 01' results, after modified conversion using Table 2, in the bit sequence '101 010 101 010'. Similarly, the bit sequence '10 01 00 01' results, after modified conversion using Table 2, in the bit sequence '001 010 101 010'. Such sequences when concatenated with subsequent patterns of the type 1010. . .—deteriorate the bit detection in a receiver. Restriction of the length of 01-sequences is thus favorable.

Since the outputs of the cells $X_1$ to $X_{10}$ of the shift register 26 are coupled to corresponding inputs of the detector unit 28, this detector unit 28 is capable of detecting the position in the serial bitstream of the source signal, where unmodified encoding would lead to a violation of the requirement that repeated minimum transition runlength is limited, and is adapted to supply a control signal at its output $O_3$ in response to such a detection.

Besides the outputs $O_1$, $O_2$ and $O_3$, the detector unit 28 comprises output $O_4$, coupled to a corresponding control signal input $c_4$ of the logic circuit LC.

More specifically, the detector unit 28 detects whether the cells $X_1$ to $X_8$ comprise the 8-bit sequences given in Table 5, and generates a third control signal at its output $O_3$.

As soon as the detector unit 28 detects this combination of four 2-bit source words present in the eight cell positions $x_1,x_2,x_3,x_4,x_5,x_6,x_7,x_8$, the logic circuit LC converts the combination in accordance with the coding given in Table 5 into a 12-bit bit sequence as given in the right column of this Table 5.

TABLE 5

| block of 4 source words | block of 4 channel words |
| --- | --- |
| 00 01 00 01 | 10x 010 010 010 | where the bit marked x may be either '0' or '1' under the influence of said control means.

Use of Table 5 restricts the repeated minimum transition runlength in the channel signal (RML) to RML=6.

In order to be able to use Table 5 correctly, it is obvious that in Table 4 the third and fourth entries must be deleted so that Table 4 must be modified into Table 4'.

TABLE 4'

| block of 4 source words | block of 4 channel words |
| --- | --- |
| 11 11 11 11 | 001 010 010 010 |
| 11 11 11 10 | 000 010 010 010 |

More specifically, the detector unit 28 detects whether the cells $X_1$ to $X_{10}$ comprise one of the 10-bit sequences given in Table 6, and generates a fourth control signal at its output $O_4$.

As soon as the detector unit 28 detects a combination of five 2-bit source words present in the ten cell positions $x_1,x_2,x_3,x_4,x_5,x_6,x_7,x_8,x_9,x_{10}$, which combination equal combinations given in the left-hand column of Table 6, the logic circuit LC converts the combination in accordance with the coding given in Table 6 into a 15-bit bit sequence as given in the right column of this Table 6.

TABLE 6

| block of 5 source words | block of 5 channel words |
| --- | --- |
| 01 11 11 11 00 | x00 010 010 010 010 |
| 01 11 11 11 01 | x01 010 010 010 010 | where the bit marked x may be either '0' or '1' under the influence of said control means, except when this would lead to a violation of the k=10 or RML=6 constraints. Use of this Table 6 restricts the k-constraint to k=10.

If the detector unit 28 detects these two combinations of five 2-bit source words, the logic circuit LC converts the combination, dependent on the RDS value of the present signal, by choosing a value '0' or '1' for the bit marked x.

Figure 3:
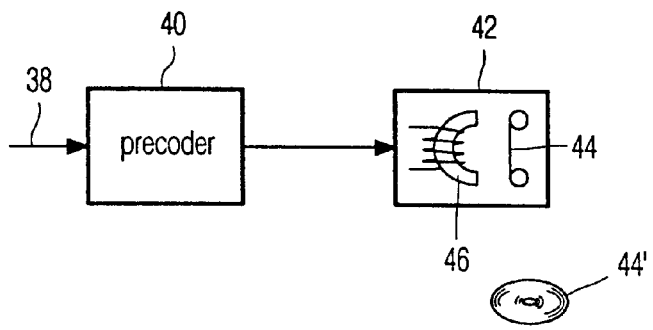
FIG. 3 shows an arrangement for precoding the serial channel signal and recording the precoded signal on a record carrier.

FIG. 3 shows an arrangement for precoding the serial channel signal and recording the precoded signal on a record carrier. The channel bitstream 38 is applied to a precoder 40. The output signal of the precoder 40 is supplied to a write unit 42 for writing the signal in a track on a record carrier 44. The record carrier 44 may be a magnetic record carrier in a longitudinal or disk form. The record carrier may be alternatively an optical record carrier, such as an optical disk 44'. The write unit 42 comprises a write head 46, which is a magnetic write head, when recording the signal on a magnetic record carrier, or an optical write head, when recording the signal on an optical record carrier.

Figure 4:
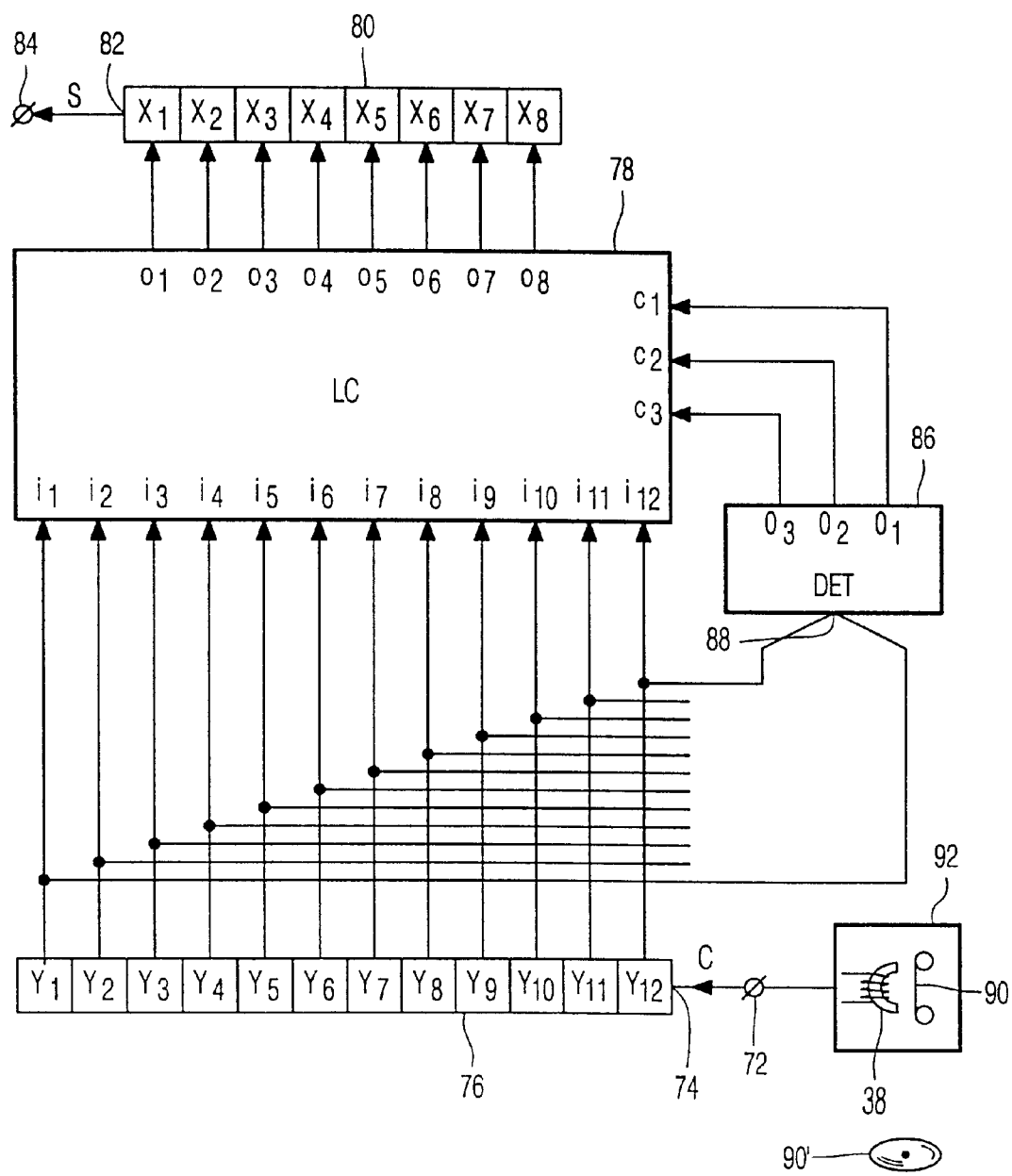
FIG. 4 shows a first embodiment of the decoding device.

FIG. 4 shows an embodiment of a decoding device for decoding the serial datastream obtained by the encoding device of FIG. 1, so as to obtain a binary source signal. The decoding device has an input terminal 72 for receiving the channel signal, which input terminal 72 is coupled to an input 74 of a shift register 76, comprising twelve cells $Y_1$ to $Y_{12}$. The shift register 76 functions as a serial-parallel converter so that blocks of four 3-bit channel words are applied to inputs $i_1$ to $i_{12}$ of a logic circuit 78. The logic circuit 78 comprises the three Tables 1, 2, 3 and 4. Outputs $o_1$ to $o_8$ of the logic circuit 78 are coupled to inputs of cells $X_1$ to $X_8$ of a shift register 80, which has an output 82 coupled to an output terminal 84. A detector unit 86 is present, having inputs $i_1$ to $i_{12}$, schematically indicated by the reference numeral 88, coupled to outputs of cells $Y_1$, to $Y_{12}$ respectively, of the shift register 76, and outputs $O_1$, $O_2$ and $O_3$ coupled to control inputs $c_1$, $c_2$ and $c_3$, respectively, of the logic circuit 78.

In the absence of the control signals, the logic circuit 78 converts the 3-bit channel word stored in the cells $Y_1$, $Y_2$ and $Y_3$ into its corresponding 2-bit source word, as per the conversion Table 1, and supplies the 2-bit source word to the cells $X_1$ and $X_2$. In the presence of the control signal at the input $c_1$, the logic circuit 78 converts the block of two 3-bit channel words stored in the cells $Y_1$, to $Y_6$ into a block of two 2-bit source words, as per the conversion Table 2, and supplies the two 2-bit source words to the cells $X_1$ to $X_4$. In the presence of the control signal at the input $c_2$, the logic circuit 78 converts the block of three 3-bit channel words stored in the cells $Y_1$, to $Y_9$ into a block of three 2-bit source words, as per the conversion Table 3, and supplies the three 2-bit source words to the cells $X_1$ to $X_6$.

In the presence of the control signal at the input $c_3$, the logic circuit 78 converts the block of four 3-bit channel words stored in the cells $Y_1$, to $Y_{12}$ into a block of four 2-bit source words, as per the conversion Table 4, and supplies the four 2-bit source words to the cells $X_1$ to $X_8$.

In this way, the serial datastream of the channel signal is converted into the serial datastream of the source signal.

The encoded information supplied to the input 72 could have been obtained from reproducing the information from a record carrier, such as a magnetic record carrier 90 or an optical record carrier 90'. To this end, reading the information from a track on the record carrier, where the unit 92 comprises a read head for reading the information from said track.

Figure 5:
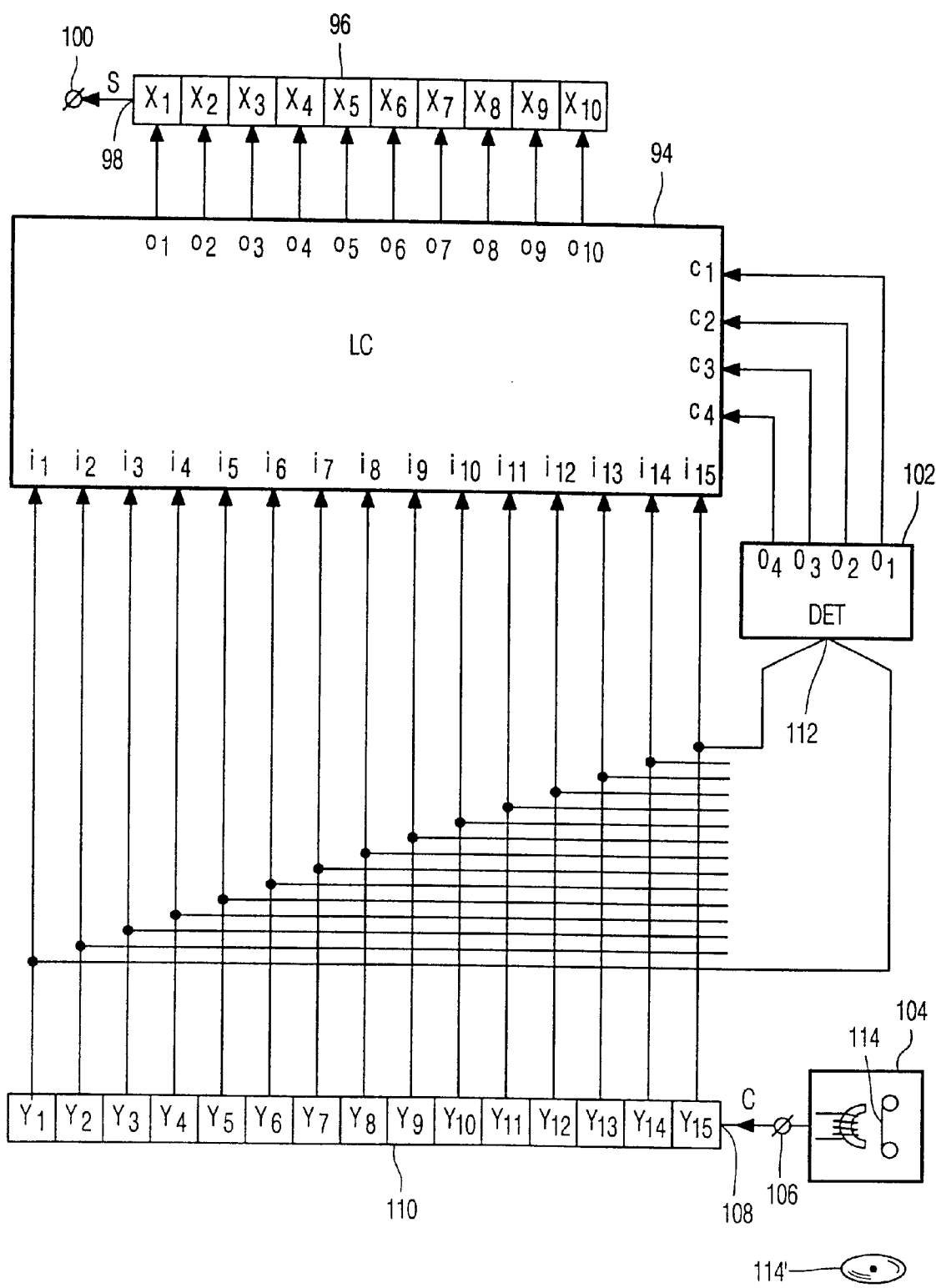
FIG. 5 shows a second embodiment of the decoding device.

FIG. 5 shows an embodiment of a decoding device for decoding the serial datastream obtained by the encoding device of FIG. 2, so as to obtain a binary source signal. The decoding device has an input terminal 106 for receiving the channel signal, which input terminal 106 is coupled to an input 108 of a shift register 110, comprising fifteen cells $Y_1$, to $Y_{15}$. The shift register 10 functions as a serial-parallel converter so that blocks of five 3-bit channel words are applied to inputs $i_1$ to $i_{15}$ of a logic circuit 94. The logic circuit 94 comprises the four Tables 1, 2, 3, 4, 5 and 6. Outputs $o_1$ to $o_{10}$ of the logic circuit 94 are coupled to inputs of cells $X_1$ to $X_{10}$ of a shift register 96, which has an output 98 coupled to an output terminal 100. A detector unit 102 is present, having inputs $i_1$ to $i_{15}$, schematically indicated by the reference numeral 112, coupled to outputs of cells $Y_1$, to $Y_{15}$, respectively, of the shift register 110, and outputs $O_1$, $O_2$, $O_3$ and $O_4$ coupled to control inputs $c_1$, $C_2$, $c_3$ and $c_4$, respectively, of the logic circuit 94.

For the detector using Table 1, 2, 3 and 4, reference is made to FIG. 4, reference is made to FIG. 4 and the description of this Figure. The detector uses Table 5 in a similar way as Table 4 to convert four 3-bit channel words into four 2-bit source words.

In the presence of the control signal at the input $c_4$, the logic circuit 94 converts the block of five 3-bit channel words stored in the cells $Y_1$, to $Y_{15}$ into a block of five 2-bit source words, as per the conversion Table 6, and supplies the five 2-bit source words to the cells $X_1$ to $X_{10}$.

In this way, the serial datastream of the channel signal is converted into the serial datastream of the source signal.

The encoded information supplied to the input 106 could have been obtained from reproducing the information from a record carrier, such as a magnetic record carrier 114 or an optical record carrier 114'. To this end, the device in FIG. 7 comprises a read unit 104 for reading the information from a track on the record carrier, where the unit 104 comprises a read head for reading the information from said track.

Whilst the invention has been described with reference to preferred embodiments, it is to be noted that these are non-limitative examples. Thus, various modifications may be apparent to those skilled in the art, without departing from the scope of the invention, as defined in the claims.

The invention also lies in each and every novel feature or combination of features.

What is claimed is:

1. A device for encoding a stream of databits of a binary source signal into a stream of databits of a binary channel signal, wherein the stream of databits of the source signal is divided into n-bit source words, which device comprises:

converting means to convert the n-bit source words into corresponding m-bit channel words in accordance with a conversion of the parity preserving type, where m and n are integers, with m>n; and control means for carrying out DC-control on the binary channel signal by introducing a freedom of choice in the source-to-channel conversion.

2. A device for encoding a stream of databits of a binary source signal into a stream of databits of a binary channel signal, wherein the stream of databits of the source signal is divided into n-bit source words, which device comprises:

converting means to convert the n-bit source words into corresponding m-bit channel words in accordance with a conversion of the parity preserving type, where m and n are integers, with m>n; and control means to minimize the repeated minimum transition runlength on the binary channel signal by introducing a freedom of choice in the source-to-channel conversion.

3. A method of encoding a stream of databits of a binary source signal into a stream of databits of a binary channel signal, comprising the steps of:

dividing the stream of databits of the source signal into n-bit source words, the source words being converted into corresponding m-bit channel words in accordance with a conversion of the parity preserving type, where m and n are integers, with m>n; and carring out DC-control on the binary channel signal by introducing a freedom of choice in the source-to-channel conversion.

4. The method of claim 3, in which a block of p consecutive n-bit source words is converted into a block of p consecutive m-bit channel words, one of the bits in the blocks of p consecutive m-bit channel words being chosen under the influence of the DC-control, p being an integer which is larger than 1.

5. A binary channel signal including a stream of databits, converted from a binary source signal, the source signal including a stream of databits of n-bit source words, the channel signal comprising:

m-bit channel words, each one of the m-bit channel words corresponding to one of the n-bit source words in accordance with a conversion of the parity preserving type, where m and n, are integers, with m>n, the words being organized into blocks; and a block of a pair of blocks of p consecutive m-bit channel words, being converted from the same block of p consecutive n-bit source words as the other block of the pair, the blocks of the pair differing from each other in the bit value at one bit position only in the blocks, p being an integer which is larger than 1.

6. A record carrier containing a binary channel signal including a stream of databits, converted from a binary source signal, the source signal including a stream of databits, wherein the stream of databits of the source signal comprises:

n-bit source words, the channel signal including m-bit channel words, each one of the m-bit channel words corresponding to one of the n-bit source words in accordance with a conversion of the parity preserving type, where m and n are integers, with m>n, the words being organized into blocks; and a block of a pair of blocks of p consecutive m-bit channel words, being converted from the same block of p consecutive n-bit source words, the blocks of the pair differing from each other in the bit value at one bit position only in the blocks, p being an integer which is larger than 1.

7. A device comprising:

means for receiving a stream of databits of a binary channel signal divided into m-bit channel words; and deconverting means to deconvert the m-bit channel words into corresponding n-bit source words in accordance with a deconversion of the parity preserving type, where m and n are integers, with m>n, to produce a stream of databits of a binary source signal, the deconversion including deconverting a channel sequence having pairs of blocks of p consecutive m-bit channel words into the same blocks of p consecutive n-bit source words, the pairs of blocks of p consecutive m-bit channel words differing from each other in the bit value at one bit position only in the blocks, p being an integer which is larger than 1.

8. The device of claim 7, in which the decoding is carried out in accordance with the following table:

| block of 3 channel words | block of 3 source words |
|---|---|
| 101 0x0 010 | 00 10 00 |
| 100 0x0 010 | 01 10 00 |
| 001 0x0 010 | 10 10 00 |
| 000 0x0 010 | 11 10 00 | when the bit marked x is '1' and the decoding is carried out in accordance with the standard decoding tables:

| source word | channel word |
|---|---|
| 00 | 101 |
| 01 | 100 |
| 10 | 001 |
| 11 | 000 | and

| block of 2 source words | block of 2 channel words |
|---|---|
| 00 00 | 100 010 |
| 00 01 | 101 010 |
| 10 00 | 000 010 |
| 10 01 | 001 010 | when the bit marked x is '0'.

9. The device of claim 8, in which the decoding is carried out in accordance with the following table:

| block of 5 channel words | block of 5 source words |
|---|---|
| x00 010 010 010 010 | 01 11 11 11 00 |
| x01 010 010 010 010 | 01 11 11 11 01 | when the bit marked x is either '0' or '1' and the decoding is carried out in accordance with the following table:

| block of 4 channel words | block of 4 source words |
|---|---|
| 001 010 010 010 | 11 11 11 11 |
| 000 010 010 010 | 11 11 11 10 |
| 10y 010 010 010 | 00 01 00 01 | where the bit marked y may be either '0' or '1'.

10. The device of claim 1, in which the converting means convert a block of p consecutive n-bit source words into a block of p consecutive m-bit channel words, at least one of the bits in the blocks of p consecutive m-bit channel words being either '0' or 1' under the influence of the control means, p being an integer which is larger than 1.

11. The device of claim 10, in which, for p=3, n=2, m=3, the converting means convert predetermined blocks of three consecutive 2-bit source words into blocks of three consecutive 3-bit channel words in accordance with the following table:

| block of 3 source words | block of 3 channel words |
|---|---|
| 00 10 00 | 101 0x0 010 |
| 01 10 00 | 100 0x0 010 |
| 10 10 00 | 001 0x0 010 |
| 11 10 00 | 000 0x0 010 | where the bit marked x may be either 0' or '1' under the influence of the control means.

12. The device of claim 9, in which, for p=4, n=2, m=3, the converting means convert predetermined blocks of three consecutive 2-bit source words into blocks of three consecutive 3-bit channel words in accordance with the following table:

| block of 4 source words | block of 4 channel words |
|---|---|
| 00 01 00 01 | 10x 010 010 010 | and that, for p=5, n=2, m=3, the converting means convert predetermined blocks of three consecutive 2-bit source words into blocks of three consecutive 3-bit channel words in accordance with the following table:

| block of 5 source words | block of 5 channel words |
|---|---|
| 01 11 11 11 00 | x00 010 010 010 010 |
| 01 11 11 11 01 | x01 010 010 010 010 | where the bits marked x may be either '0' or '1 under the influence of the control means.

13. The device of claim 1, in which the device further comprises preceding means for preceding the channel signal so as to obtain a precoded channel signal, and recording means for recording the precoded channel signal onto a record carrier.

14. The device of claim 13, in which the record carrier is an optical record carrier.

15. The method of claim 3, in which the method further comprises the step of precoding the channel signal so as to obtain a precoded channel signal, and the step of recording the precoded channel signal onto a record carrier.

16. The method of claim 15, in which the record carrier is an optical record carrier.

17. The method of claim 1, in which:

the coverting means convert a block of p consecutive n-bit source words into a block of p consecutive m-bit channel words, at least one of the bits in the blocks of p consecutive m-bit channel words being either '1' or 1' under the influence of the control means, p being an integer which is larger than 1;

for p=3, n=2, m=3, the converting means convert predetermined blocks of three consecutive 2-bit source words into blocks of three consecutive 3-bit channel words in accordance the following table:

| block of 3 source words | block of 3 channel words |
|---|---|
| 00 10 00 | 101 0x0 010 |
| 01 10 00 | 100 0x0 010 |
| 10 10 00 | 001 0x0 010 |
| 11 10 00 | 000 0x0 010 | where the bit marked x may be either '0' or '1' under the influence of the control means;

for p=4, n=2, m=3, the converting means convert predetermined blocks of three consecutive 2-bit source words into blocks of three consecutive 3-bit channel words in accordance with the following table:

| block of 4 source words | block of 4 channel words |
|---|---|
| 00 01 00 01 | 10x 010 010 010 | and that, for p=5, n=2, m=3, the converting means convert predetermined blocks of three consecutive 2-bit source words into blocks of three consecutive 3-bit channel words in accordance with the following table:

| block of 5 source words | block of 5 channel words |
|---|---|
| 01 11 11 11 00 | x00 010 010 010 010 |
| 01 11 11 11 01 | x01 010 010 010 010 | where the bits marked x may be either '1' or '1' under the influence of the control means;

the device further comprises preceding means for preceding the channel signal so as to obtain a precoded channel signal, and recording means for recording the precoded channel signal onto a record carrier; and the record carrier is an optical record carrier.

18. The device of claim 2, in which:

the converting means convert a block of p consecutive n-bit source words into a block of p consecutive m-bit channel words, at least one of the bits in the blocks of p consecutive m-bit channel words being either '0' or '1' under the influence of the control means, p being an integer which is larger than 1;

for p=3, n=2, m=3, the converting means convert predetermined blocks of three consecutive 2-bit source words into blocks of three consecutive 3-bit channel words in accordance with the following table:

| block of 3 source words | block of 3 channel words |
|---|---|
| 00 10 00 | 101 0x0 010 |
| 01 10 00 | 100 0x0 010 |
| 10 10 00 | 001 0x0 010 |
| 11 10 00 | 000 0x0 010 | where the bit marked x may be either '0' or 1' under the influence of the control means;

for p=4, n=2, m=3, the converting means convert predetermined blocks of three consecutive 2-bit source words into blocks of three consecutive 3-bit channel words in accordance with the following table:

| block of 4 source words | block of 4 channel words |
|---|---|
| 00 01 00 01 | 10x 010 010 010 | and that, for p=5, n=2, m=3, the converting means convert predetermined blocks of three consecutive 2-bit source words into blocks of three consecutive 3-bit channel words in accordance with the following table:

| block of 5 source words | block of 5 channel words |
|---|---|
| 01 11 11 11 00 | x00 010 010 010 010 |
| 01 11 11 11 01 | x01 010 010 010 010 | where the bits marked x may be either '0' or '1' under the influence of the control means;

the device further comprises preceding means for precoding the channel signal so as to obtain a precoded channel signal, and recording means for recording the precoded channel signal onto a record carrier; and the record carrier is an optical record carrier.

19. The method of claim 3, in which:

a block of p consecutive n-bit source words is converted into a block of p consecutive m-bit channel words, one of the bits in the blocks of p consecutive m-bit channel words being chosen under the influence of the DC-control, p being an integer which is larger than 1;

the method further comprises the step of preceding the channel signal so as to obtain a precoded channel signal, and the step of recording the precoded channel signal onto a record carrier; and the record carrier is an optical record carrier.

* * * * *